(12) United States Patent
Mergard

(10) Patent No.: US 6,530,050 B1
(45) Date of Patent: Mar. 4, 2003

(54) INITIALIZING AND SAVING PERIPHERAL DEVICE CONFIGURATION STATES OF A MICROCONTROLLER USING A UTILITY PROGRAM

(75) Inventor: Jim Mergard, Pflugerville, TX (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 0 days.

(21) Appl. No.: 09/209,119

(22) Filed: Dec. 10, 1998

(51) Int. Cl.[7] ............................................... G01R 31/28
(52) U.S. Cl. ............................... 714/726; 710/8; 700/83
(58) Field of Search ........................ 714/726, 730, 714/731, 724, 725, 30, 718, 732–733; 710/8; 703/1; 700/33, 84, 83; 327/202, 215

(56) References Cited

U.S. PATENT DOCUMENTS

| | | | |
|---|---|---|---|
| 4,947,357 A | 8/1990 | Stewart | 714/726 |
| 5,281,864 A | 1/1994 | Hahn et al. | 327/202 |
| 5,291,495 A | 3/1994 | Udell, Jr. | 714/726 |
| 5,325,368 A | 6/1994 | James et al. | 714/727 |
| 5,329,533 A | 7/1994 | Lin | 714/727 |
| 5,416,409 A | 5/1995 | Hunter | 324/158.1 |
| 5,434,804 A | 7/1995 | Bock et al. | 702/117 |
| 5,477,545 A | 12/1995 | Huang | 714/727 |
| 5,608,736 A | 3/1997 | Bradford et al. | 714/727 |
| 5,623,503 A | 4/1997 | Rutkowski | 714/727 |
| 5,627,841 A * | 5/1997 | Nakamura | 714/731 |
| 5,636,228 A | 6/1997 | Moughanni et al. | 714/726 |
| 5,668,490 A | 9/1997 | Mitra et al. | 327/203 |
| 5,717,701 A | 2/1998 | Angelotti et al. | 714/30 |
| 5,726,999 A | 3/1998 | Bradford et al. | 714/727 |
| 5,784,382 A * | 7/1998 | Byers et al. | 714/718 |
| 5,892,503 A * | 4/1999 | Kim | 341/22 |
| 5,978,902 A * | 11/1999 | Mann | 712/227 |
| 6,068,194 A * | 5/2000 | Mazur | 235/492 |
| 6,363,501 B1 * | 3/2002 | Tobias et al. | 710/8 |

OTHER PUBLICATIONS

IEEE standard test access port and boundary—scan architecture Test Technology Technical Committee of the IEEE Computer Society, USA; IEEE Std 1149.1–1990, May 21, 1990;Abstract.*

* cited by examiner

*Primary Examiner*—Albert Decady
*Assistant Examiner*—Guy Lamarre
(74) *Attorney, Agent, or Firm*—Akin Gump Strauss Hauer & Feld LLP

(57) ABSTRACT

A microcontroller has many internal peripheral devices. The peripheral devices have many registers that can be used to configure the peripheral devices for a particular application. The configuration registers are coupled to a scan path where configuration scan data can be inputted or outputted from an external memory. A utility program is used to precalculate and display appropriate configuration scan data. The utility program can also create an output. The output can be loaded into the external memory or can be a data file. Further, the utility program can extract configuration scan data from the external memory, for debug and test.

24 Claims, 8 Drawing Sheets

INITIALIZING AND SAVING PERIPHERAL DEVICE CONFIGURATION STATES OF A MICROCONTROLLER USING A UTILITY PROGRAM

BACKGROUND OF THE INVENTION

1. Field of the Invention

The apparatus and method according to the invention pertains to peripheral states registers embedded in a microcontrollers, and more specifically, using computer software and scan hardware to capture and load peripheral device states.

2. Description of the Related Art

The proliferation of electronic goods such as telephones, televisions, and video camcorders has been made possible by integrated circuit technology. One type of integrated circuit especially important to electronic devices is the microcontroller.

A microcontroller, or embedded controller, is similar to a microprocessor as used in a personal computer, but with a great deal of additional functionality combined onto the same monolithic semiconductor substrate (i.e., chip). In a typical personal computer, the microprocessor performs the basic computing functions, but other integrated circuits perform functions such as communicating over a network, providing input/output with the user, and controlling peripherals.

In a typical microcontroller, many of these functions are embedded within the integrated circuit chip itself. A typical microcontroller, such as the Am186ES by Advanced Micro Devices, Inc., of Sunnyvale, Calif., not only includes a core microprocessor, but further includes a memory controller, a direct memory access (DMA) controller, an interrupt controller, and both asynchronous and synchronous serial interfaces. In computer systems, these peripheral devices are typically implemented as separate integrated circuits, requiring a larger area and increasing the size of the product. By embedding these functions within a single chip, size and cost are reduced, often important in consumer products.

From a consumer products designer's viewpoint, often the particular combination of added features make a particular microcontroller attractive for a given application. Many microcontrollers are available that use the standard 80×86 microprocessor instructions, allowing for software to be easily developed for such microcontrollers. Because of the similar execution unit instruction sets, the added features often become principal differentiating criteria between particular microcontrollers.

The peripheral devices embedded in a microcontroller each have their own individual registers. Typical peripheral device registers include state registers, instruction registers, address registers, status registers and data registers. Depending on the peripheral, certain registers store configuration information needed for the peripheral's proper operation during start up. On system start up, the execution unit initializes each peripheral device with device specific initial configuration data. This initialization could occur during a cold start-up, zero-volt suspend/resume procedure or after a system crash.

In addition to having peripheral devices, many of today's microcontrollers have embedded test circuitry. In 1985, a group of European companies formed Joint European Test Action Group (JETAG) to devise ways to reduce manufacturing costs. One concept was to incorporate such test circuitry into standard components (controlled via software), eliminating the need for sophisticated in-circuit test equipment. This concept gained support in the U.S., where in 1988, several North American companies formed the Joint Test Access Group (JTAG) consortium to formalize the concept. In 1990, the Institute of Electrical and Electronic Engineers (IEEE) refined the concept and created the 1149.1 standard (which is incorporated herein by reference), known as IEEE Standard Test Access Port and Boundary Scan Architecture.

In such an architecture, a JTAG test device is connected to a microcontroller and performs a "boundary-scan test" on the microcontroller. Boundary scan cells contain shift register elements that connect together to form a scan chain around the core logic circuit. Input/Output (I/O) signals freely pass between integrated circuit (IC) pins and the core logic, through the boundary scan cells, in normal mode. However, in test mode, only test signals are allowed to pass into or out of the core logic, via a test port and through the boundary scan chain, providing observability and controllability of the input and output signals. The JTAG test commands are typically drawn from a fairly limited set of commands particularly adapted for testing the interconnections of microcontrollers and are not typically well suited for testing or monitoring its internal logic. Instructions and associated data for testing are read serially into each microcontroller peripheral boundary scan cell registers and read out serially, and after the instructions has been carried out the result is read out serially.

Furthermore, access to registers of peripheral devices may not be possible using processor I/O commands. Some of these registers may not have both read/write capabilities. Thus, data cannot be written to read-only registers with processor I/O commands and data cannot be read from write-only registers with processor I/O commands.

SUMMARY OF THE INVENTION

According to the present invention, a utility program can configure a memory with configuration states of peripheral devices of a microcontroller. The memory can be a programmable read only memory (PROM), such as a flash memory. The utility program can create an output. The output can be loaded into the memory or can be an output file. The configuration states can be loaded with scan hardware into configuration registers of various embedded peripheral devices of the microcontroller.

Furthermore, according to the present invention, the utility program can be used to examine the contents of configuration registers of embedded peripheral devices of the microcontroller. Configuration states are scanned out into the memory with scan hardware. The utility program can display the contents of the configuration registers on a screen for test and debug.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

The following disclosure is hereby incorporated by reference: The assignee of the present invention, Advanced Micro Devices, Inc., has addressed a scan path for loading, saving configuration data of peripheral devices embedded in a microcontroller, as disclosed in U.S. patent application Ser. No. 09/209,190, entitled "METHOD AND APPARATUS FOR SAVING PERIPHERAL DEVICE STATES OF A MICROCONTROLLER" now U.S. Pat. No. 6,363,501, and herein incorporated by reference as if set forth in its entirety.

Figure 1:
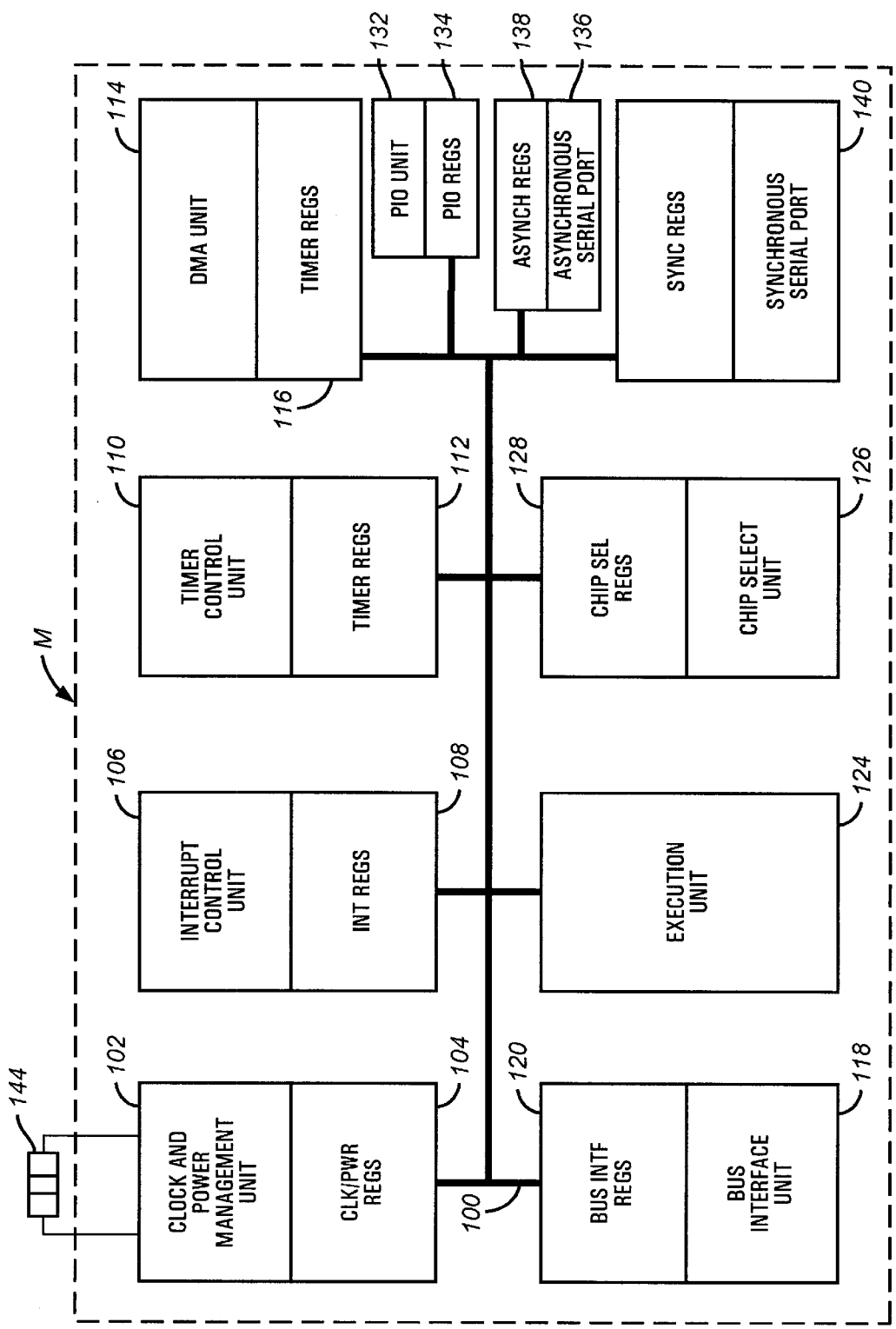
FIG. 1 shows a typical microcontroller in which the techniques of this invention can be implemented.

Turning to FIG. 1, shown is a block diagram of a typical microcontroller M implemented according to the invention. Such a microcontroller is preferably implemented on a single monolithic integrated circuit. The microcontroller M preferably includes an internal bus 100 coupling a variety of functional units and registers used to control and monitor those units. These include a clock and power management unit 102 with corresponding clock/power registers 104, an interrupt control unit (ICU) 106 with corresponding interrupt registers 108, a timer control unit 110 with corresponding timer registers 112, a direct memory access (DMA) unit 114 with corresponding DMA registers 116, a bus interface unit 118 with corresponding bus interface registers 120, an execution unit 124 which is essentially a microprocessor core, a chip select unit 126 with corresponding chip select registers 128, a programmable input/output (PIO) unit 132 with corresponding PIO registers 134, an asynchronous serial port 136 with corresponding asynchronous register 138, and a synchronous serial port 140 with corresponding synchronous registers 142. Further, note the clock and power management unit 102 includes external pads connected to a crystal 144, which provides the timing not only for the execution unit 124, but also for generating the serial clock in the asynchronous serial port 136.

The block diagram of the microcontroller M is typical of microcontrollers, and could be for example, the Am186ES microcontroller by Advanced Micro Devices, Inc., of Sunnyvale, Calif. The techniques and circuitry according to the invention, however, could be applied to a wide variety of microcontrollers as well as other devices that use a non-ideal clock for generation of asynchronous serial port clocks. Further, the term "microcontroller" has differing definitions in industry. Some companies refer to a processor core with additional features (such as I/O) as a "microprocessor" if it has no onboard memory, and digital signal processors (DSPs) are now used for both special and general purpose controller functions. So as here used, the term "microcontroller" covers all of the products, and generally means an execution unit with added functionality all implemented on a single monolithic integrated circuit.

SCAN HARDWARE

Microcontrollers that are IEEE 1149.1 compliant have boundary scan paths that couple the registers of peripheral device's I/O pins. Boundary scan provides access to the periphery of the microcontroller, but not the internal registers of the execution unit and peripheral devices. In full scan path design all registers are connected in the scan paths. Scan paths connect individual flip-flops within a register and then connect the registers, e.g., bit one of register one is connected to bit two of register one, and bit two is connected to bit three of register one, and so on until the last bit of register one is connected to bit one of register two. According to the invention, scan is implemented on sufficient registers to save configuration state of the device. Furthermore, it is not necessary to capture all data from each register to determine the state of the device. For instance, data from a status register may not be needed to determine the configuration state of the device.

Figure 2:
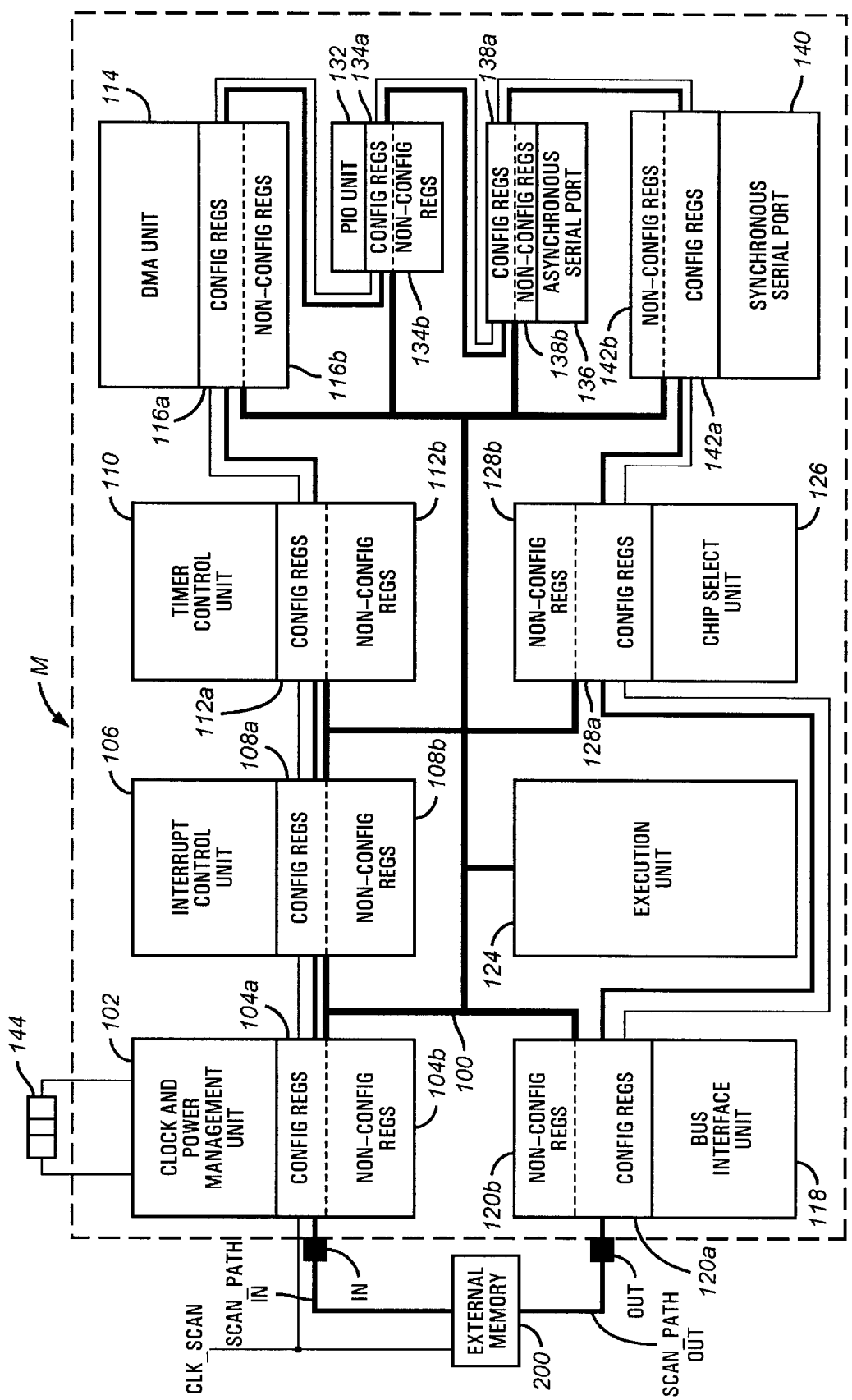
FIG. 2 is a block diagram illustrating a scan path between peripheral devices.

FIG. 2 illustrates typical peripheral devices embedded in a microcontroller M with a scan path. An input pin IN of microcontroller M is provided to shift configuration data into each peripheral configuration register. The configuration registers of the clock and power management unit 102, interrupt control unit 106, timer control unit 110, DMA unit 114, PIO unit 132, asynchronous serial port 136, synchronous serial port 140, chip select unit 126 and bus interface unit 118 are daisy chained (i.e., serially connected) together via signal line SCAN_PATH. For illustrative purposes, the SCAN_PATH line from the output of the bus interface unit configuration registers 120a is coupled to the output pin OUT of the microcontroller M. Configuration scan data is synchronously shifted in or out of each configuration register utilizing clock CLK_SCAN. The configuration scan data out pin OUT is coupled to an external memory 200. Thus, the configuration scan data from each peripheral device is sequentially shifted out of each configuration register into external memory 200 via SCAN_PATH. Likewise, the external memory 200 is coupled to the input pin IN, so that configuration scan data from external memory 200 can be synchronously shifted into each peripheral configuration register via SCAN_PATH.

PERIPHERAL DEVICE REGISTERS

Peripheral devices embedded in microcontrollers have many different registers that store data for use in a variety of functions. Sometimes, registers necessarily define a configuration state of a peripheral. Other times, registers contain transitory information (such as UART receive status bits) that are not strictly needed to establish the peripheral's configuration. Further, whether a register has information "necessary" to define a peripheral configuration may depend on the particular implementation of the peripheral and its applications. As an illustration, one such peripheral device is an asynchronous serial port 136. A common asynchronous serial port is a Universal Asynchronous Receiver and Transmitter (UART) 300. The UART 300 is one peripheral that provides a serial interface of the microcontroller M. Some of the peripheral's functions include the serialization of parallel data and the insertion of start, parity, and stop bits, or the parallelization of serial data and the separation of start, parity, and stop bits.

Figure 3:
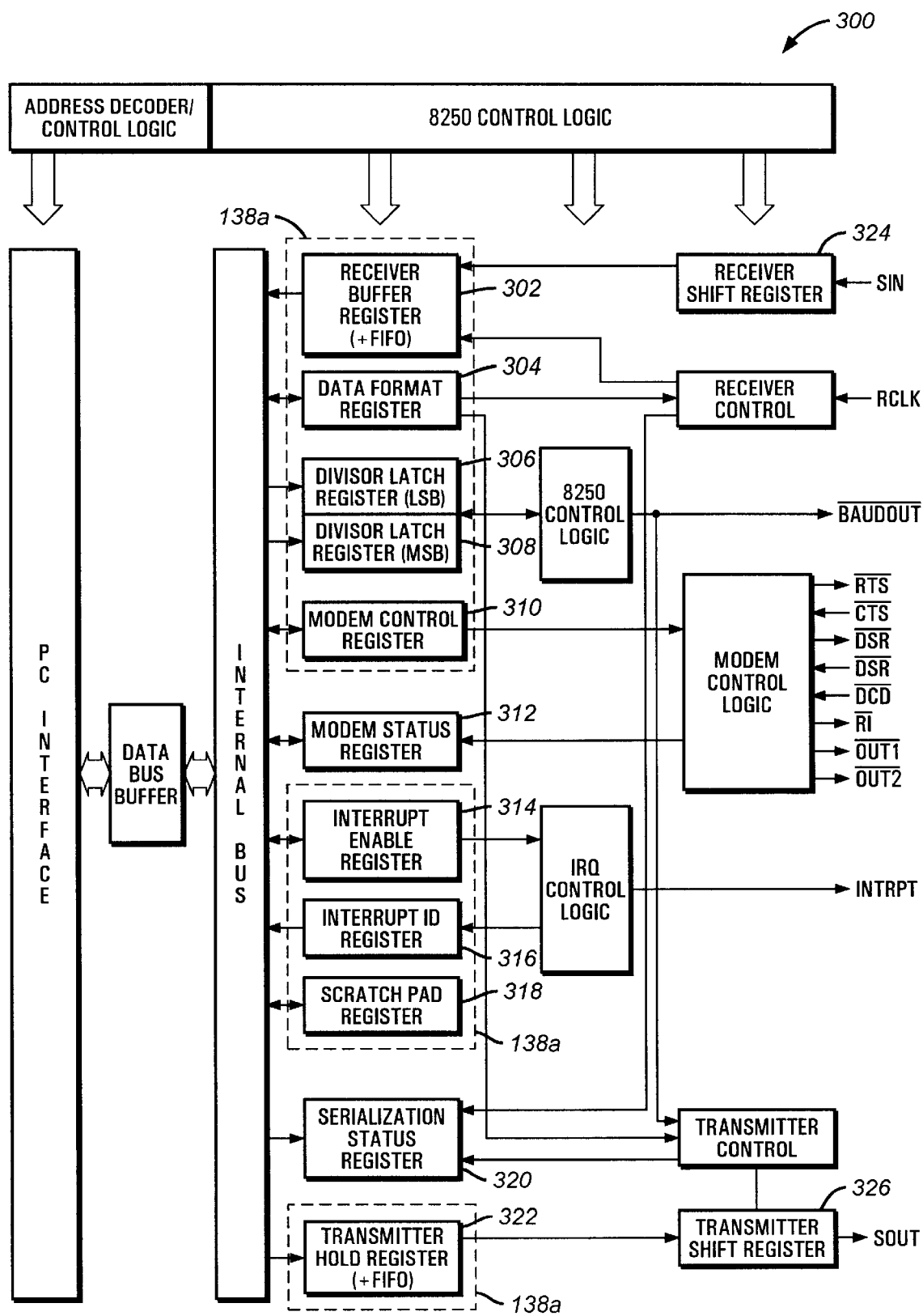
FIG. 3 is a block diagram illustrating the internal registers of a peripheral device, namely a universal asynchronous receiver and transmitter (UART).

FIG. 3 is a block diagram of a typical implementation of the UART 300. The UART 300 has eleven configuration and status registers. The configuration registers include a receiver buffer register 302, data format register 304, divisor latch register (LSB) 306, divisor latch register (MSB) 308, modem control register 310, interrupt enable register 314, interrupt ID register 316, scratch pad register 318, and transmitter hold register 322. The status registers include a modem status register 312 and a serialization status register 320. The registers provide the necessary storage area for interfacing the UART 300 to the rest of the peripheral devices of microcontroller M.

CONFIGURATION STATE REGISTERS

Figure 4:
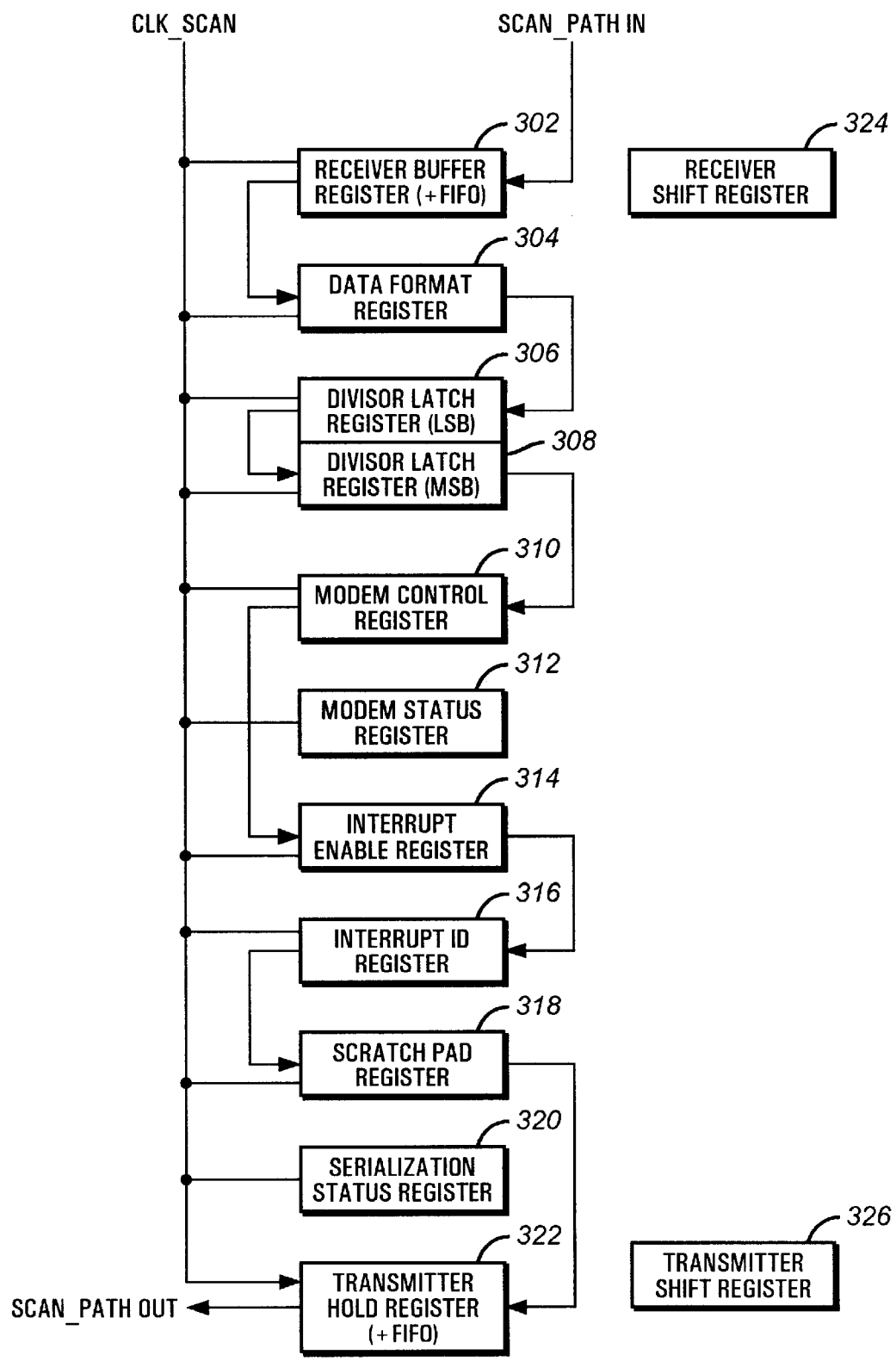
FIG. 4 is a block diagram illustrating configuration registers within a peripheral device.

FIG. 4 is a block diagram of a scan path coupling the registers of a peripheral device. For illustrative purposes, the registers from the UART 300 are shown. Since it is not necessary to capture the data from all registers, the scan path couples those registers used to define the peripheral device's configuration. For example, in this implementation the status registers 312 and 320, receiver shift register 324 and transmitter shift register 326 of the device are left out of the scan path. A clock signal CLK_SCAN is provided to the device for synchronous data shifting. The SCAN_PATH IN is coupled to the receiver buffer 302. The SCAN_PATH IN line could have originated from a SCAN_PATH OUT of other peripheral device or from input pin IN. The registers from the receiver buffer 302 are coupled to the data format register 304. Next, the divisor latch (LSB) register 306 is coupled to the divisor latch (MSB) register 308. The divisor latch (MSB) register 308 is then coupled to the modem control register 310. Next, the modem control register 310 is coupled to the interrupt enable register 314, bypassing the modem status register 312. The interrupt enable register 314 is then coupled to the interrupt ID register 316. The interrupt ID register 316 is coupled to the scratch pad register 318. The scratch pad register 318 is coupled to the transmitter hold register 322, bypassing the serialization status register 320. The transmitter hold register 322 is then coupled to the next peripheral configuration register or output pin OUT.

One skilled in the art could appreciate that inclusion or exclusion of particular registers to be saved can be different from system to system. That is, some predetermined subset of configuration registers could differ according to the system. For example, in a high speed system that quickly restarts, it might be desirable to include status registers in the scan path. Thus, the modem status register 312 and/or serialization status register 320 of the UART 300 can be included in the scan path.

In addition, internal registers (as opposed to I/O registers) can be included in the scan path. The contents of these registers are typically not ascertainable without debug tools or the addition of shadow registers, but it might be desirable to include these registers in the scan path. For example, the receiver shift register 324 and/or transmitter shift register 326 of the UART 300 can be included in the scan path.

Furthermore, externally accessible registers (I/O registers) may have read, write, or read/write capabilities. But using standard I/O commands in data cannot be saved from write-only registers nor written to read-only registers. As an example, the receiver buffer register 302 is typically a read-only register. Configuration data normally cannot be loaded into this register with a write command from execution unit 124.

This inability to read from or write to particular registers can present problems when saving and restoring a peripherals state through routines run by the execution unit 124. Typically, when entering and exiting low power or hibernation modes, a peripherals state is saved and restored via low level power up and power down routines. But this becomes problematic when read- or write-only registers (or hidden registers) are employed. Similar problems arise with locked registers and registers that access different functionality on reads than on writes (i.e., a read returns status; a write alters control).

These legacy-style registers could be made read/write, but that might cause existing software to malfunction. The registers could be made read/write in response to a special mode of operation, but that could require extensive modifications to peripheral cores. Therefore, saving and restoring a peripheral gracefully can be difficult when the peripheral has read-only, write-only, locked, hidden, or otherwise inaccessible registers.

Using the configuration scan path according to the invention provides a graceful approach to those problems. Whether registers necessary for peripheral configuration are read-only, write-only, hidden, locked, or otherwise difficult to save and restore using processor reads and writes, the configuration scan chain can capture that information.

Returning to the example of the receiver buffer register 302, because it is coupled to the scan path (as shown in FIG. 4), configuration scan data can be shifted into this register via SCAN_PATH. Likewise, the transmitter hold register 322 typically has write-only capabilities. Data from this register normally cannot be ascertained with I/O commands (or memory commands for memory mapped I/O) from execution unit 124. As shown in FIG. 4, transmitter hold register 322 is coupled to the scan path and configuration scan data can be shifted out of this register via SCAN_PATH.

Finally, an example of a peripheral device with external registers that cannot be accessed easily by software due to the nature of the hardware. One example is the interrupt control unit 106. A common interrupt control unit is the legacy 8259A style programmable interrupt controller. This controller uses four initialization control words, namely Initialization Command Words (ICW) ICW1–ICW4, which are written sequentially into the device via a single I/O port to four registers. The four registers can be included as configuration registers 108a and are typically write-only registers. Therefore, the registers cannot be read back out. As shown in FIG. 2, coupling the configuration registers 108a to the scan path, configuration scan data of the interrupt control unit 106 can be loaded into external memory 200.

The configuration registers of the various peripheral devices are initially set at system start-up. During the system start-up, the execution unit of the microcontroller typically executes a boot block program. The boot block program typically contains many lines of code. Typically, one of the functions of the boot block program is to have the execution unit of the microcontroller to write configuration data to configuration I/O registers. Boot block programs are typically burned into read only memory (ROM). Numerous lines of code are needed to load each configuration register of each peripheral device with initial configuration data.

MEMORY STORAGE DEVICE

Configuration scan data that is clocked out of the peripheral devices is preferably stored in external memory 200. Configuration scan data can also be clocked into the peripheral device from external memory 200. Various memory storage devices could be utilized, both volatile and non-volatile. One embodiment of the present invention would utilize a reprogrammable ROM. Several types of ROMs are available for storing a boot block and configuration scan data. The first generation of ROMs had its code hardwired internally and could not be reprogrammed later. Should it become necessary to update the ROMs code, the ROM typically would have to be replaced with another ROM that had the updated code.

Newer generations of ROMs are available with features that include reprogrammability. These ROMs are generally referred to as erasable programmable ROMs (EPROMs). One of type of EPROM is an electronically erasable programmable ROM (EEPROM). The EEPROM is in-system writable and non-volatile. The EEPROM can be programmed and erased by electronic pulses. EEPROMs are typically undesirable to store the boot block program since they are expensive and have little storage capacity.

A more recent EEPROM is a flash ROM (also known as a flash memory). The flash ROM can be quickly reprogrammed without being removed from the system. The flash ROM can be updated under system software control while being physically connected to the system. The flash ROM can be updated, while the system is operational, from a variety of possible sources, including removable disks, modem links, or parallel or serial ports.

Thus using the flash ROM as the external memory, configuration scan data could be sequentially shifted out of the peripheral device configuration registers of microcontroller M into external memory 200 via a pin OUT using SCAN_PATH.

IEEE 1149.1 JTAG BOUNDARY SCAN AND TEST ACCESS PORT

Another embodiment of the invention utilizes the JTAG boundary scan path and Test Access Port (TAP) hardware to save the configuration data of the peripheral devices or load configuration data into the peripheral devices. For microcontrollers that are IEEE 1149.1 compliant, the scan paths SCAN_PATH for each peripheral configuration register can be coupled to the boundary scan. The IEEE 1149.1 standard (May 21, 1990), is described in the publication IEEE Standard Test Access Port and Boundary-Scan Architecture, published by the IEEE, Piscataway, N.J. (herein incorporated by reference.)

A command instruction is loaded through the TAP. When the registers are clocked, configuration data is shifted out of the peripheral device register onto the boundary scan path. In addition, the memory storage device could be coupled to the Test Access Port for easy load/storage of configuration data.

UTILITY PROGRAM

Figure 5:
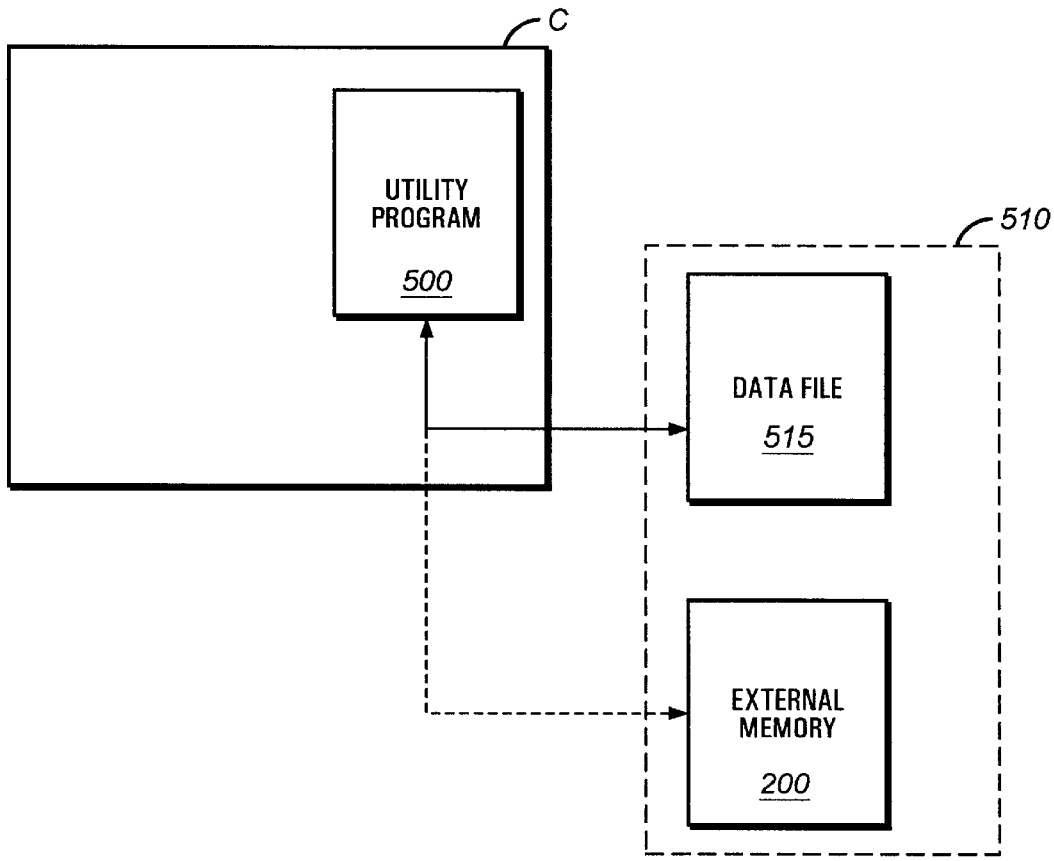
FIG. 5 is a block diagram illustrating a utility program and an output.

According to the invention, a utility program 500 can be used to precalculate and display appropriate configuration scan data. The utility program 500 can be run on a general purpose computer, such as a personal computer (PC). FIG. 5 is a block diagram illustrating a utility program and the utility program's output. The utility program 500 typically resides in computer C. In one embodiment, the utility program 500 provides configuration scan data to an output 510. The output 510 can be either a data file 515 or external memory 200. The configuration scan data in data file 515 can be manipulated by the utility program 500. The data file 515 can then be inputted into the external memory 200, such as a flash ROM.

The utility program 500 can also provide configuration scan data to the external memory 200. The configuration scan data can then be loaded into various peripheral device configuration registers as previous discussed.

The utility program 500 is also useful to evaluate stored configuration scan data. It may be desirable to know the entire peripheral configuration at certain instants during embedded system operation, such as on errors, power down, etc. The microcontroller M can be programmed to perform a configuration scan save on these events. The configuration scan data can then be retrieved from the external memory 200, and displayed using the utility program 500. Thus, configuration scan data can be retrieved from SCAN_PATH, and stored in the external memory 200. As FIG. 5 illustrates, the utility program 500 can capture the configuration scan data from the external memory 200.

Figure 6:
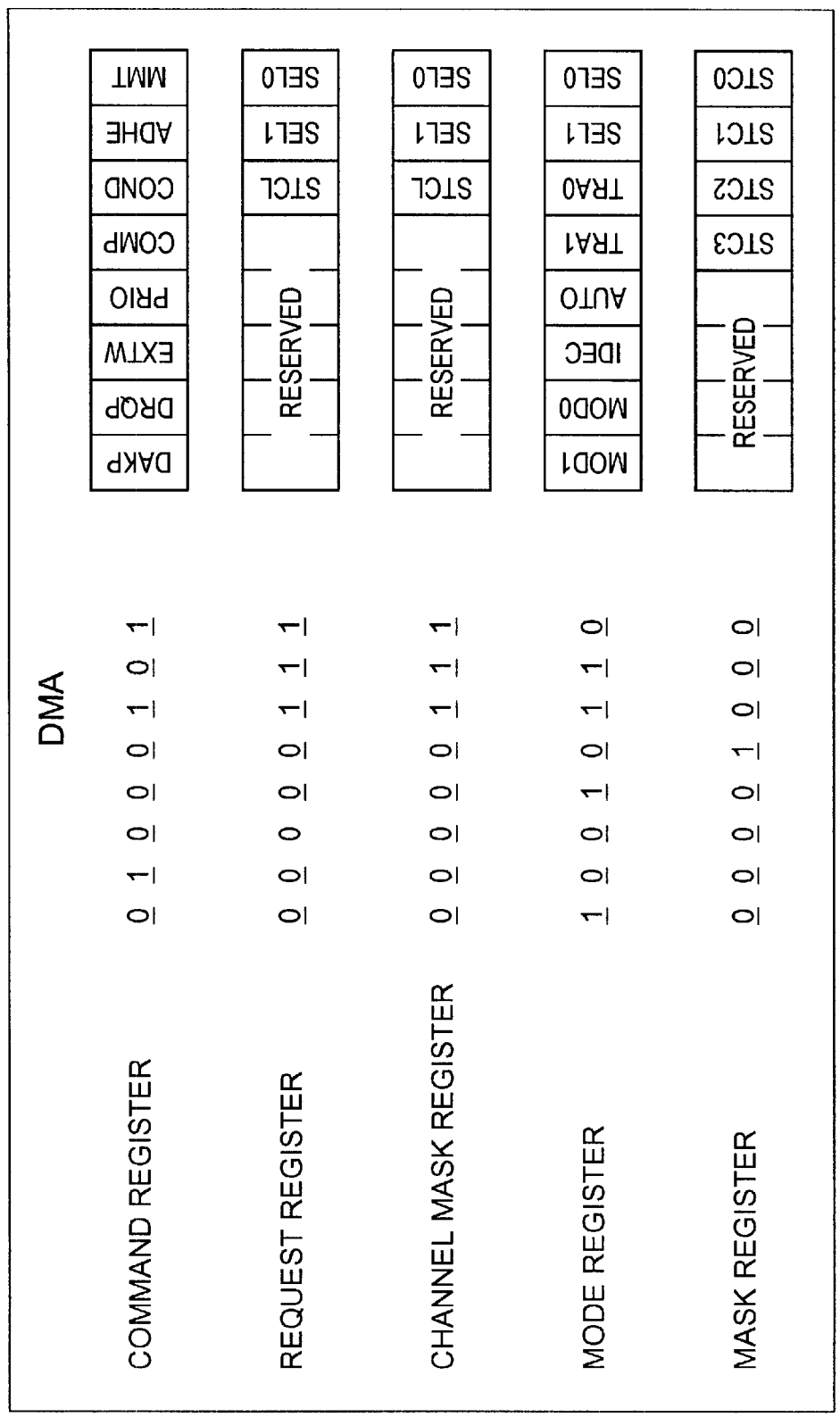
FIG. 6 illustrates a screen display of the contents of DMA configuration registers.

FIG. 6 illustrates a screen display of the DMA configuration registers 116a. The user can program the DMA configuration registers at the bit level. Other peripheral devices can also be configured in the same manner. In one embodiment, the output 510 of the utility program 500 can then be loaded into the external memory 200, such as a flash ROM. In the alternative, the user can examine the contents of configuration registers of any or all peripheral devices of the microcontroller M. The utility program 500 can then save configuration states of peripheral devices a file 515 for programming the external memory 200, could directly program the external memory 200, or could otherwise store the data in the external memory 200.

Thus, the utility program 500 allows a system designer to "virtually configure" a microcontroller with a configuration scan path using an easy-to-interpret display. That data can then be saved to a file or directly used to program the external memory that will provide the configuration scan data for the peripheral devices of microcontroller M.

Figure 7:
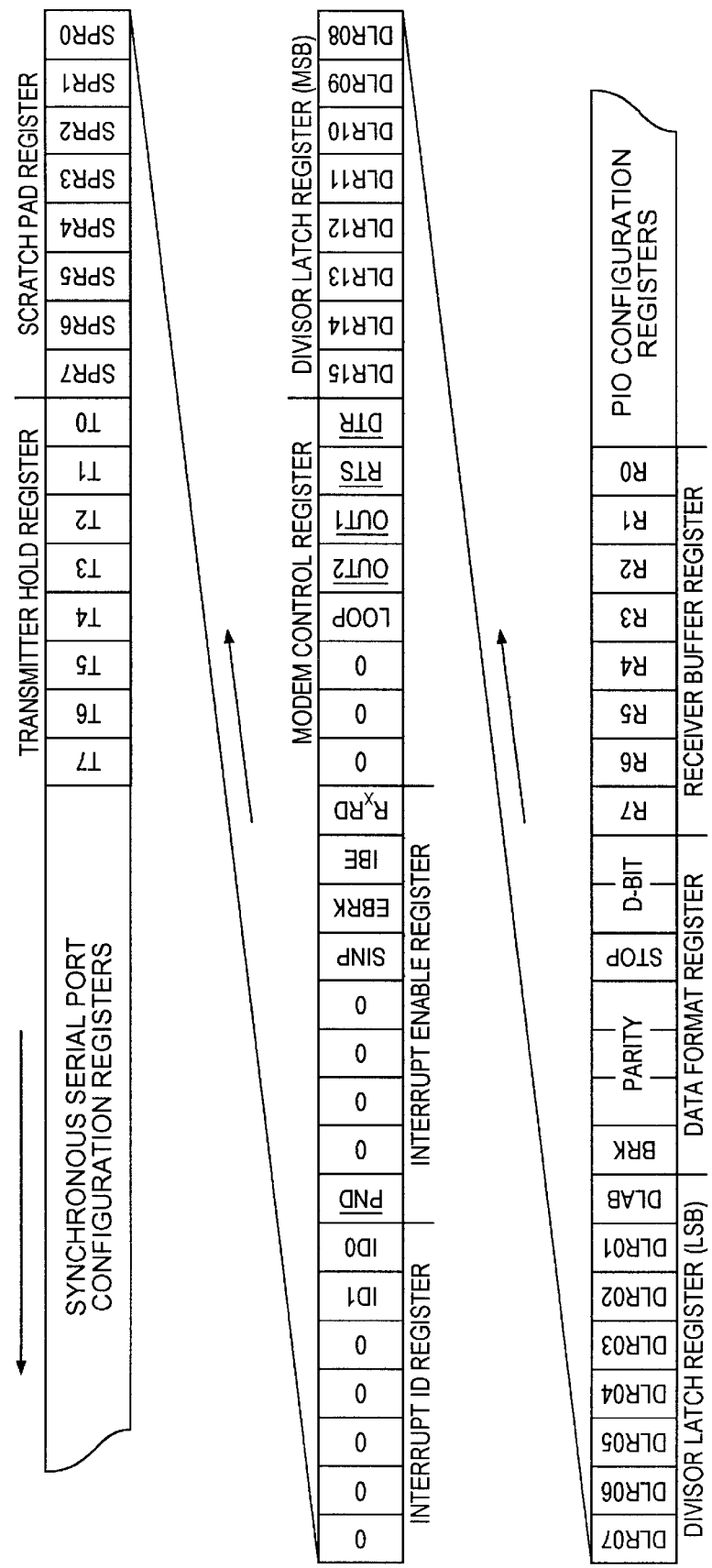
FIG. 7 illustrates a sample configuration data stream.

FIG. 7 illustrates a typical output (whether directly to the external memory or to a data file) of the utility programs. The configuration data is sequentially formatted for loading the configuration registers of the peripheral devices of microcontroller M via SCAN_PATH. FIG. 7 illustrates the configuration scan data for the UART configuration registers 138a. Since the configuration data is sequentially loaded into all configuration registers, the configuration scan data preceding the UART configuration data is synchronous serial port configuration data, as shown in the exemplary layout of peripheral devices in FIG. 2. Likewise, the configuration scan data after the UART configuration data is for the PIO configuration registers 134a. The order of the configuration scan data is dependent on the layout of the peripheral devices in the particular microcontroller and how they are coupled to the SCAN_PATH. As with programmable logic devices, each microcontroller can have an associated "configuration scan definition file" that defines the ordering of the configuration scan path, the types of corresponding register data to be displayed by the utility program 500, etc. That definition file could allow the utility program 500 to use a predefined display for standard types of peripherals such as standard UARTs, but could provide all necessary data to display for special peripherals.

Figure 8:
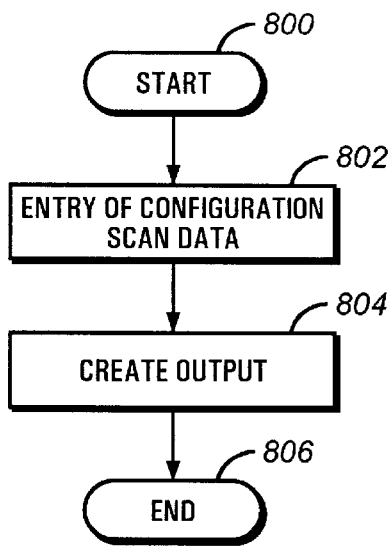
FIG. 8 is a flow chart illustrating a method of a utility program creating an output for use in a configuration scan path.

FIG. 8 is a flow chart illustrating a method of a utility program creating an output for use in a configuration scan path. The method starts at step 800. The utility program 500 accepts user input of configuration data at step 802. The utility program 500 then creates an output at step 804. The method ends at step 806.

Figure 9:
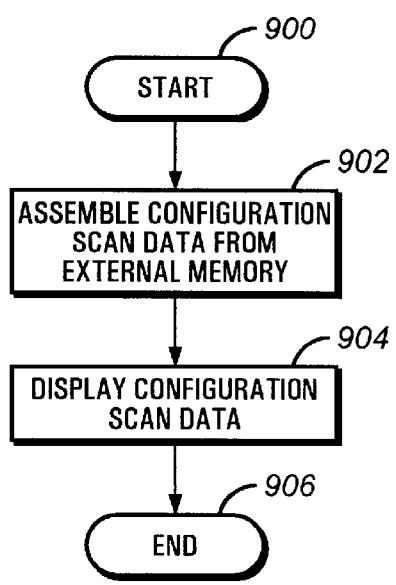
FIG. 9 is a flow chart illustrating a method of a utility program displaying the contents of an external memory coupled to a configuration scan path.

FIG. 9 is a flow chart illustrating a method of a utility program displaying the contents of an external memory continuing configuration scan data from a configuration scan path. The method starts at step 900. The utility program assembles the configuration data from external memory 200 at step 902. The utility program displays the configuration data of each peripheral device for use for debug or test at step 904. The method ends at step 906.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A software program for running on a general purpose computer for use in programming a memory that provides configuration scan information for a microcontroller that implements a configuration scan path, the program comprising code that when executed performs the steps of displaying registers that are part of the configuration scan path of the microcontroller;

accepting user assignment of values to the displayed registers; and creating output data that corresponds to memory contents that when loaded through the configuration scan path into the microcontroller, configures the registers with the corresponding values assigned by the user.

2. The software program of claim 1, wherein the output data is a data file.

3. The software program of claim 1, further comprising the step of:

loading the output data to the memory.

4. The software program of claim 1, wherein the assignment of values to the displayed registers is different for the microcontrollers that are different.

5. The software program of claim 1, wherein the registers that are part of the configuration scan path of the microcontroller are defined by a definition file.

6. The software program of claim 1, wherein the registers are configuration registers of an asynchronous serial port device.

7. A software program for running on a general purpose computer for use in examining a memory that provides configuration scan information for a microcontroller that implements a configuration scan path, the program comprising code that when executed performs the steps of inputting output data that corresponds to configuration scan information of the microcontroller; and displaying registers that correspond to the output data.

8. The software program of claim 7, wherein the registers are configuration registers of a DMA peripheral device.

9. The software program of claim 7, wherein the registers are configuration registers of a asynchronous serial port device.

10. The software program of claim 7, wherein the registers are configuration registers of a interrupt control unit peripheral.

11. A computer executed method of creating a memory that provides configuration scan information for a microcontroller that implements a configuration scan path, the method comprising the steps of:

displaying registers that are part of the configuration scan path of the microcontroller;

accepting user assignment of values to the displayed registers; and creating output data that corresponds to memory contents that when loaded through the configuration scan path into the microcontroller, configures the registers with the corresponding values assigned by the user.

12. The computer executed method of claim 11, wherein the memory is non-volatile.

13. The computer executed method of claim 11, wherein the memory is a flash ROM.

14. The computer executed method of claim 11, wherein the output data is a file.

15. The computer executed method of claim 11, further comprising the step of:

loading the output data to the memory.

16. The computer executed method of claim 15, wherein the registers are configuration registers of an asynchronous serial port peripheral device.

17. The computer executed method of claim 11, wherein the registers that are part of the configuration scan path of the microcontroller are defined by a definition file.

18. The computer executed method of claim 11, wherein the registers are configuration registers of a DMA peripheral device.

19. The computer executed method of claim 11, wherein the registers are configuration registers of an asynchronous serial port peripheral device.

20. A computer executed method of displaying a memory that provides for a microcontroller that implements a configuration scan path, the method comprising the steps of:

inputting output data that corresponds to configuration scan information of the microcontroller; and displaying registers that correspond to the output data.

21. A computer executed method of claim 20, wherein the memory is non-volatile.

22. A computer executed method of claim 20, wherein the memory is a flash ROM.

23. The computer executed method of claim 20, wherein the output data is a data file.

24. The computer executed method of claim 20, wherein the registers are configuration registers of a DMA peripheral device.

* * * * *